United States Patent
El-Batal et al.

(10) Patent No.: US 11,516,941 B2
(45) Date of Patent: Nov. 29, 2022

(54) HEAT SINK AND PRINTED CIRCUIT BOARD ARRANGEMENTS FOR DATA STORAGE SYSTEMS

(71) Applicant: Seagate Technology LLC, Fremont, CA (US)

(72) Inventors: Mohamad El-Batal, Superior, CO (US); David Copeland, Nederland, CO (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/025,968

(22) Filed: Sep. 18, 2020

(65) Prior Publication Data
US 2022/0095487 A1    Mar. 24, 2022

(51) Int. Cl.
*H05K 7/20* (2006.01)
*H05K 1/02* (2006.01)

(52) U.S. Cl.
CPC ....... *H05K 7/20563* (2013.01); *H05K 1/0203* (2013.01); *H05K 7/2039* (2013.01); *H05K 7/20154* (2013.01); *H05K 2201/10121* (2013.01)

(58) Field of Classification Search
CPC ............. H05K 7/20836; H05K 7/1487; H05K 7/2039; H05K 7/20736; H05K 7/20809; H05K 7/20772; H05K 7/20818; H05K 7/20781; H05K 1/0203; H05K 7/1489; H05K 7/20172; H05K 7/20709; H05K 2201/066; H05K 7/20563; H05K 7/20154; H05K 2201/10121
See application file for complete search history.

(56) References Cited

U.S. PATENT DOCUMENTS

| | | | | |
|---|---|---|---|---|
| 9,504,189 B1* | 11/2016 | Campbell | ............... | F25B 21/02 |
| 2005/0259397 A1* | 11/2005 | Bash | .................. | H05K 7/20772 361/699 |
| 2006/0248359 A1* | 11/2006 | Fung | ..................... | G06F 3/0634 713/300 |
| 2007/0047206 A1* | 3/2007 | Lee | ........................ | H01L 23/467 361/703 |
| 2008/0239665 A1* | 10/2008 | Franz | .................... | F04D 29/646 361/695 |
| 2009/0207565 A1* | 8/2009 | Glover | ............... | H05K 7/20836 361/688 |
| 2013/0141863 A1* | 6/2013 | Ross | .................... | H05K 7/1488 361/679.33 |
| 2018/0143518 A1* | 5/2018 | Tsai | ................... | G02B 27/0006 |

OTHER PUBLICATIONS

Morgan, Thomthy Prickett, "Gen-Z Memory Servers Loom on the Horizon," The Next Platform, Jan. 9, 2020.

* cited by examiner

*Primary Examiner* — Adam B Dravininkas
(74) *Attorney, Agent, or Firm* — Faegre Drinker Biddle & Reath LLP

(57) ABSTRACT

A system includes an enclosure having an air inlet end and an air outlet end, air movers positioned near the air outlet end, a first data connector positioned near the air outlet end between the air movers, a heat-generating electrical component positioned immediately between the data connector and the air inlet end, a first heat sink positioned immediately between at least one of the air movers and the air inlet end, and a first conductive pipe thermally coupled between the heat-generating electrical component and the first heat sink.

19 Claims, 7 Drawing Sheets

HEAT SINK AND PRINTED CIRCUIT BOARD ARRANGEMENTS FOR DATA STORAGE SYSTEMS

SUMMARY

In certain embodiments, a system includes an enclosure having an air inlet end and an air outlet end, air movers positioned near the air outlet end, a first data connector positioned near the air outlet end between the air movers, a heat-generating electrical component positioned immediately between the data connector and the air inlet end, a first heat sink positioned immediately between at least one of the air movers and the air inlet end, and a first conductive pipe thermally coupled between the heat-generating electrical component and the first heat sink.

In certain embodiments, an enclosure includes a front air inlet end, a rear air outlet end, air movers positioned near the rear air outlet end to draw air from the front air inlet end, an integrated circuit mechanically and electrically coupled to a printed circuit board, and a heat sink thermally coupled to the integrated circuit via a conductive pipe and positioned within an envelope of at least one of the air movers.

In certain embodiments, a method for cooling electronic components positioned within an enclosure is disclosed. The method includes transferring heat from an integrated circuit to a first heat sink and to a second heat sink via conductive elements. The method also includes operating air movers within the enclosure to pull air between a first set of fins of the first heat sink and between a second set of fins of the second heat sink. The first heat sink and the second heat sinks are positioned within respective envelopes of at least one of the air movers.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
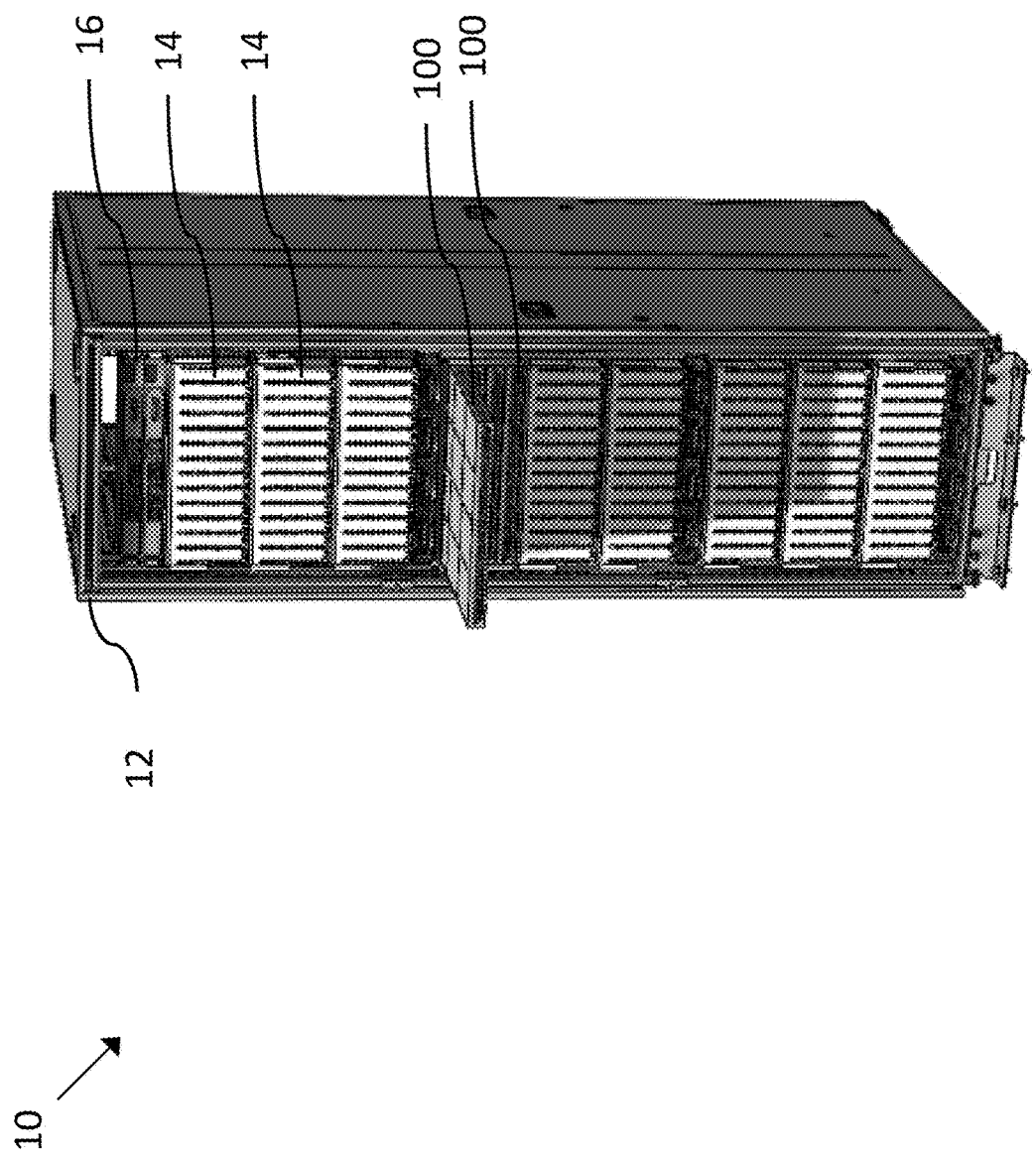
FIG. 1 shows a data storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Data storage systems can utilize one or more enclosures, which house data storage devices and electronic equipment. These devices and equipment generate heat, which can be challenging to manage in enclosures. Certain embodiments of the present disclosure are directed to systems, methods, and devices for managing heat within enclosures.

FIG. 1 shows a data storage system 10 including a rack 12 (e.g., a cabinet) with multiple mass-storage enclosures 14 (e.g., 4-unit (4U) enclosures) and separate power shelfs 16, which house power supply units to power various data storage devices, cooling units, and other electronics of the data storage system 10.

The data storage system 10 includes one or more enclosures 100, one of which is shown in FIG. 1 partially pulled out of the rack 12. Various features of the enclosure 100 are shown in more detail in FIGS. 2-7.

Figure 2:
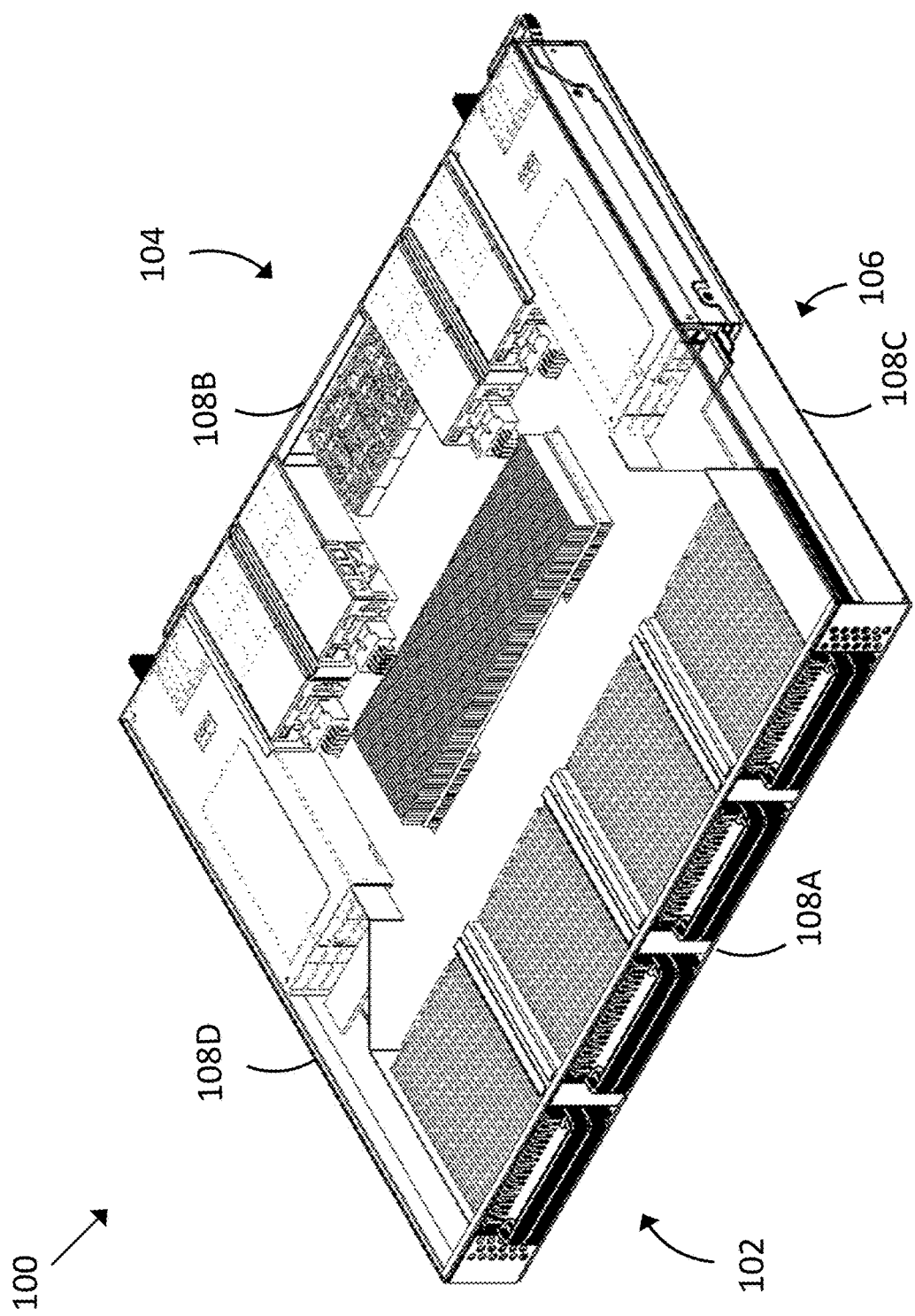
FIG. 2 shows a schematic perspective view of an enclosure of the data storage system of FIG. 1, in accordance with certain embodiments of the present disclosure.

FIG. 2 shows a schematic perspective view of the enclosure 100. The enclosure 100 includes a front end 102, which can be referred to as the air inlet end, and a back end 104, which can be referred to as the air outlet end. The enclosure 100 includes a chassis 106 with a lower wall 108A, an upper wall 108B, a first side wall 108C, and a second side wall 108D. In certain embodiments, the enclosure 100 is a 1U-sized enclosure. In such embodiments, the enclosure 100 is sized to be inserted into and removed from slots in racks sized for 1U enclosures. Although the enclosure 100 is described as a 1U-sized enclosure, the features of the enclosure 100 described in more detail below can be used in other sized enclosures.

Figure 3:
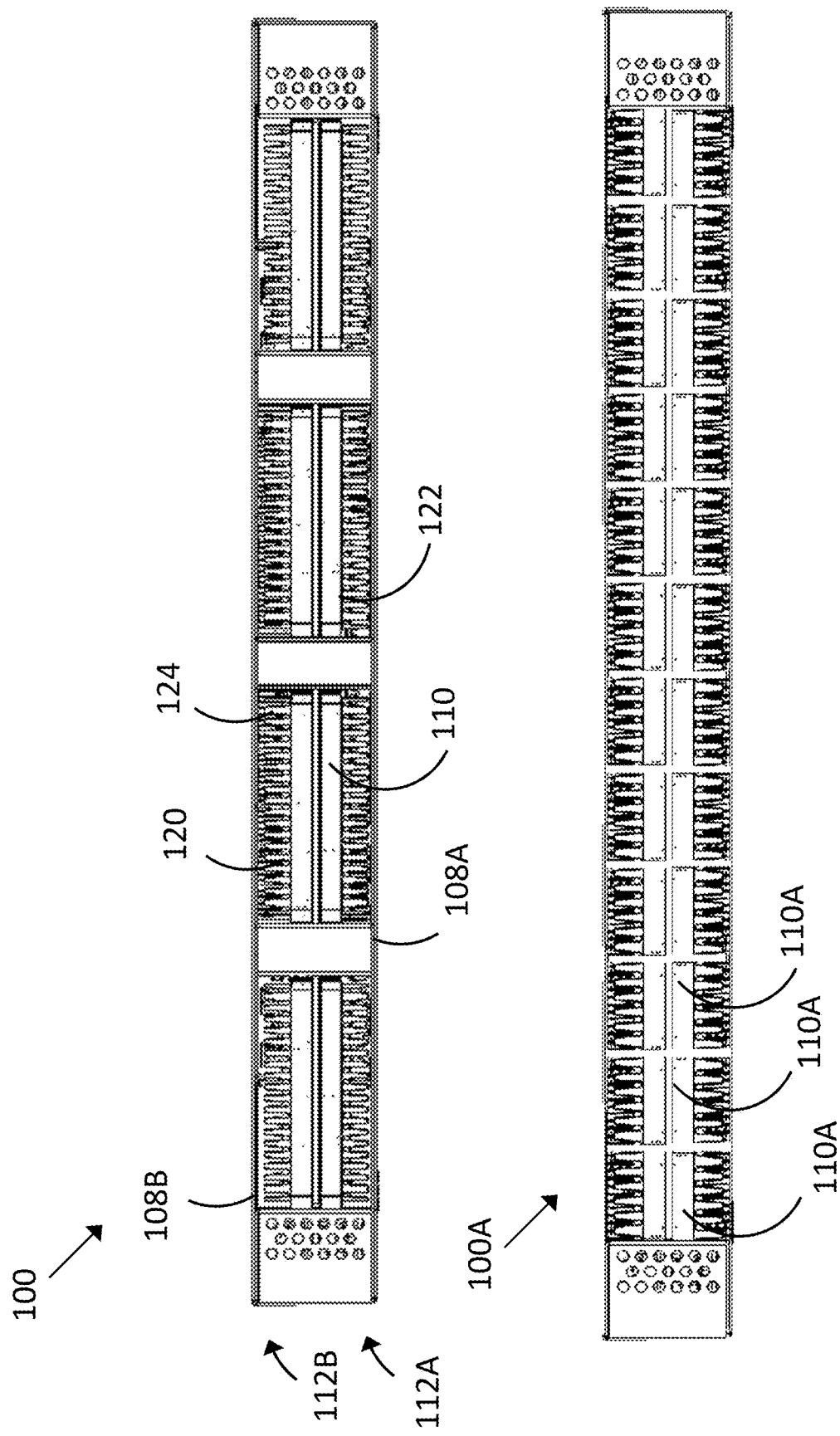
FIG. 3 shows schematic front views of alternative arrangements of memory modules for the enclosure of FIG. 2, in accordance with certain embodiments of the present disclosure.
Figure 4:
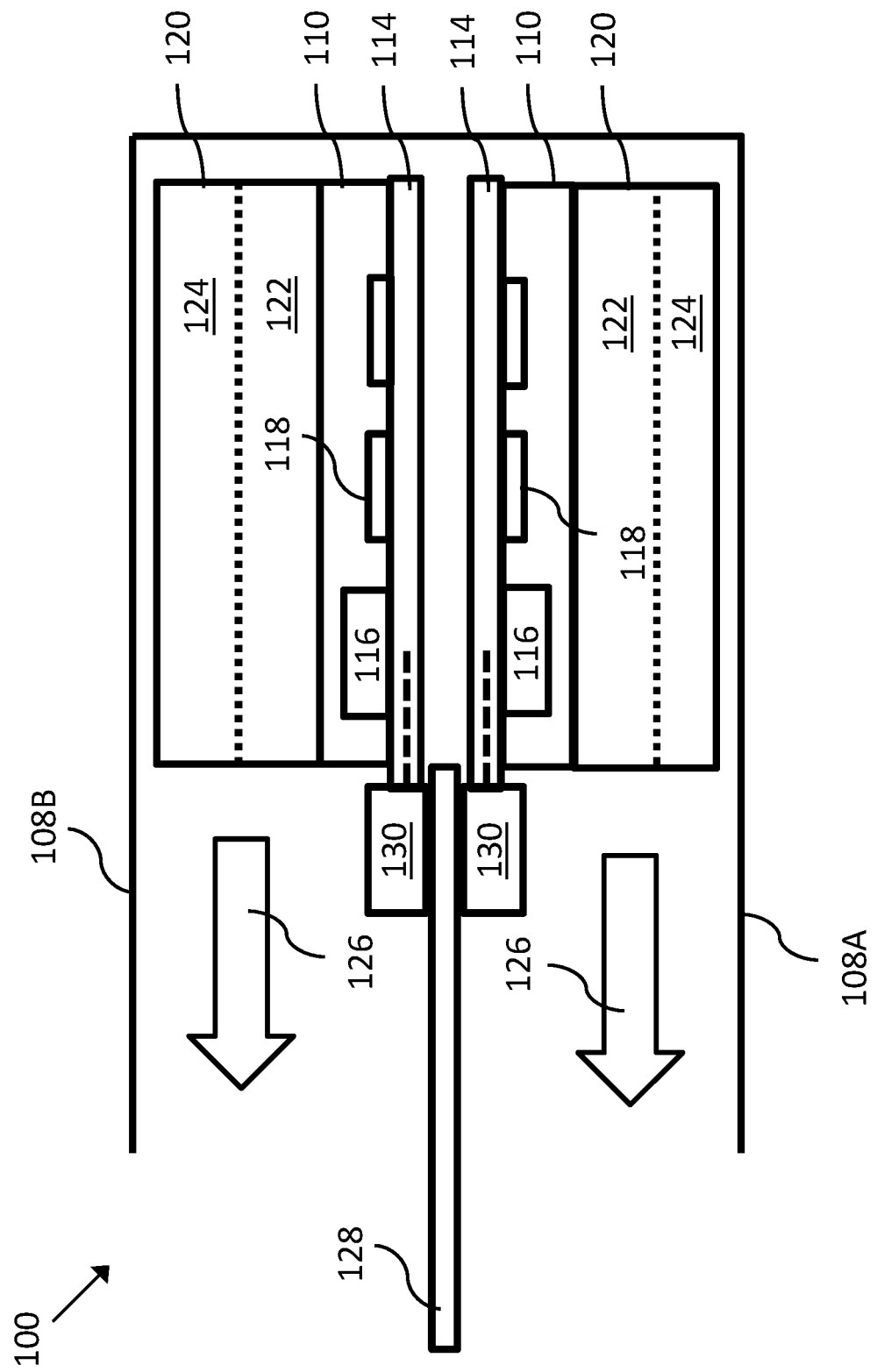
FIG. 4 shows a schematic side cut-away view of a portion of the enclosure of FIGS. 2 and 3, in accordance with certain embodiments of the present disclosure.

FIG. 3 shows a schematic front view of the enclosure 100, and FIG. 4 shows a schematic side cut-away view of a portion of the enclosure 100 near the front end 102. As shown in both figures, the enclosure 100 includes memory modules 110 positioned near the front end 102 or air inlet end of the enclosure 100. The enclosure 100 includes a lower row 112A of memory modules 110 and an upper row 112B of memory modules 110.

FIG. 4 shows the memory modules 110 (e.g., memory module assemblies) including a printed circuit board 114, a controller integrated circuit 116 (e.g., an application-specific integrated circuit), and one or more memory chips 118 (each containing many memory cells). The memory chips 118 can comprise storage-class memory cells such as MRAM memory cells, ReRAM memory cells, DRAM memory cells, among many other potential types of memory cells useful in the memory chips 118. The components of the memory modules 110 function to process and store data. In certain embodiments, the memory modules 110 include features to function under, or comply with, the EDSFF E3.S 16-lane standards, in which a Gen-Z Memory Module (ZMM) or CXL Memory Module (XMM) implementations are considered possible solutions.

When powered on and operating, the memory modules 110 will generate heat. To help cool the memory modules 110, the memory modules 110 can be coupled to one or more heat sinks 120, which comprise materials such as aluminum that have a relatively high coefficient of thermal conductivity. The heat generated by the memory modules 110 can be transferred to the heat sinks 120 to reduce the temperature of the memory modules 110.

As shown in FIG. 3, the heat sinks 120 can each include a base 122 (e.g., base portion of the heat sinks 120) with a set of fins 124 (e.g., finned portion of the heat sinks 120) extending from the base 122. The base 122 and the fins 124 can form a single integral structure where the base 122 and the fins 124 are not separate components coupled together. The base 122 can be coupled (e.g., directly coupled) to the memory module 110 such that at least a portion (e.g., bottom surface) of the base 122 is in contact with the memory module 110. In certain embodiments, one or more structures or materials are positioned between the memory modules 110 and the heat sinks 120 to facilitate heat transfer from the memory modules 110 to the heat sinks 120. In certain embodiments, the memory module 110 has an outer housing with the controller integrated circuit 116 and one or more memory chips 118 positioned within a cavity of the housing. In such embodiments, the base 122 can be attached to a portion of the housing.

The fins 124 can be spaced from each other such that there are gaps between the fins 124. In certain embodiments, the heat sinks 120 includes scores or hundreds of thin fins 124 with small gaps therebetween. The gaps allow air to pass through the heat sinks 120. As shown in FIG. 4 by arrows 126 (representing the direction of air flow), air flows in a direction such that the air first enters the enclosure 100 at the front end 102 and passes through the heat sink 120 (e.g., in between the fins 124). As the memory modules 110 generate heat, the heat is conducted to the heat sink 120 at the base 122 and travels to the fins 124, which are convectively cooled by the air passing across the fins 124. The air is heated as it passes through the heat sink 120.

As shown in FIGS. 3 and 4, the memory modules 110 in the lower row 112A are oriented differently than the memory modules 110 in the upper row 112B. More specifically, the memory modules 110 in the lower row 112A are oriented such that the heat sinks 120 are positioned underneath the memory modules 110 (e.g., between the lower wall 108A and the memory module 110), while the memory modules 110 in the upper row 112B are oriented such that the heat sinks 120 are positioned above the memory modules 110 (e.g., between the upper wall 108B and the memory module 110).

As such, the memory modules 110 in the lower row 112A can be said to have an orientation that is the opposite (e.g., flipped or rotated approximately 180 degrees) of the memory modules 110 in the upper row 112B. In such an orientation, the printed circuit boards 114 of the memory modules 110 are both positioned between the heat sinks 120 of the respective memory modules 110.

Although the enclosure 100 is shown with 4 memory modules 110 per row, the enclosure 100 can include additional memory modules (e.g., 5 per row for a total of 10 memory modules 110 in the enclosure 100). As another example, the lower enclosure 100A in FIG. 3 shows an alternative arrangement of memory modules. In this example, instead of a single memory module and heat sink, the space is used for three individual memory modules 110A each with their own heat sink and electrical connector—although a single heat sink for each group of three memory modules could be used. As such, the enclosure 100A includes 24 memory modules 110 such as E1.S modules.

As shown in FIG. 4, the enclosure 100 includes a printed circuit board 128 that is electrically coupled to the memory modules 110. To distinguish the printed circuit board 128 from those of the memory modules 110, the printed circuit board 128 will be referred to as the motherboard 128. The motherboard 128 transfers power to the memory modules 110. Further, the motherboard 128 communicates data to and from the memory modules 110. As shown in FIG. 4, the motherboard 128 includes electrical connectors 130 for coupling to each memory module 110. For example, one electrical connector 130 is positioned on a bottom side of the motherboard 128 for connecting to one memory module 110, and another electrical connector 130 is positioned on a top side of the motherboard 128 for connecting to another memory module 110. Interfaces of respective memory modules 110 can be inserted into respective electrical connectors 130.

With the orientations of the memory modules 110, a single printed circuit board (e.g., the motherboard 128) can be used to electrically connect to the memory modules 110 without intervening printed circuit boards. In a typical data storage enclosure, a first printed circuit board extends horizontally near the bottom wall of the enclosure. A second printed circuit board, which is sometimes referred to as a mid-plane circuit board, extends vertically (e.g., perpendicularly) from the first printed circuit board. Because of its vertical orientation, the mid-plane circuit board blocks airflow which reduces the ability to maintain the enclosure within desired temperature ranges. However, with the orientations of the memory modules 110, the motherboard 128 does not require a separate mid-plane circuit board. Instead, the motherboard 128 can extend along a plane that extends between the memory modules 110. In certain embodiments, the motherboard 128 can be considered a "floating" motherboard in that the motherboard 128 is not necessarily support by the bottom wall 108A or floor of the chassis 106. For example, the motherboard 128 can be supported by support structures connected to or formed by the sidewalls 108C and 108D of the chassis 106.

With the arrangement of the memory modules 110 and the motherboard 128, the airflow 126 can pass from the front end 102 of the enclosure 100 through the heat sinks 120 and to the back end 104 of the enclosure without being altered or blocked by a mid-plane circuit board. As such, the arrangement of the memory modules 110 and the motherboard 128 helps improve the ability for air to cool the memory modules 110 and therefore the enclosure 100.

Figure 5:
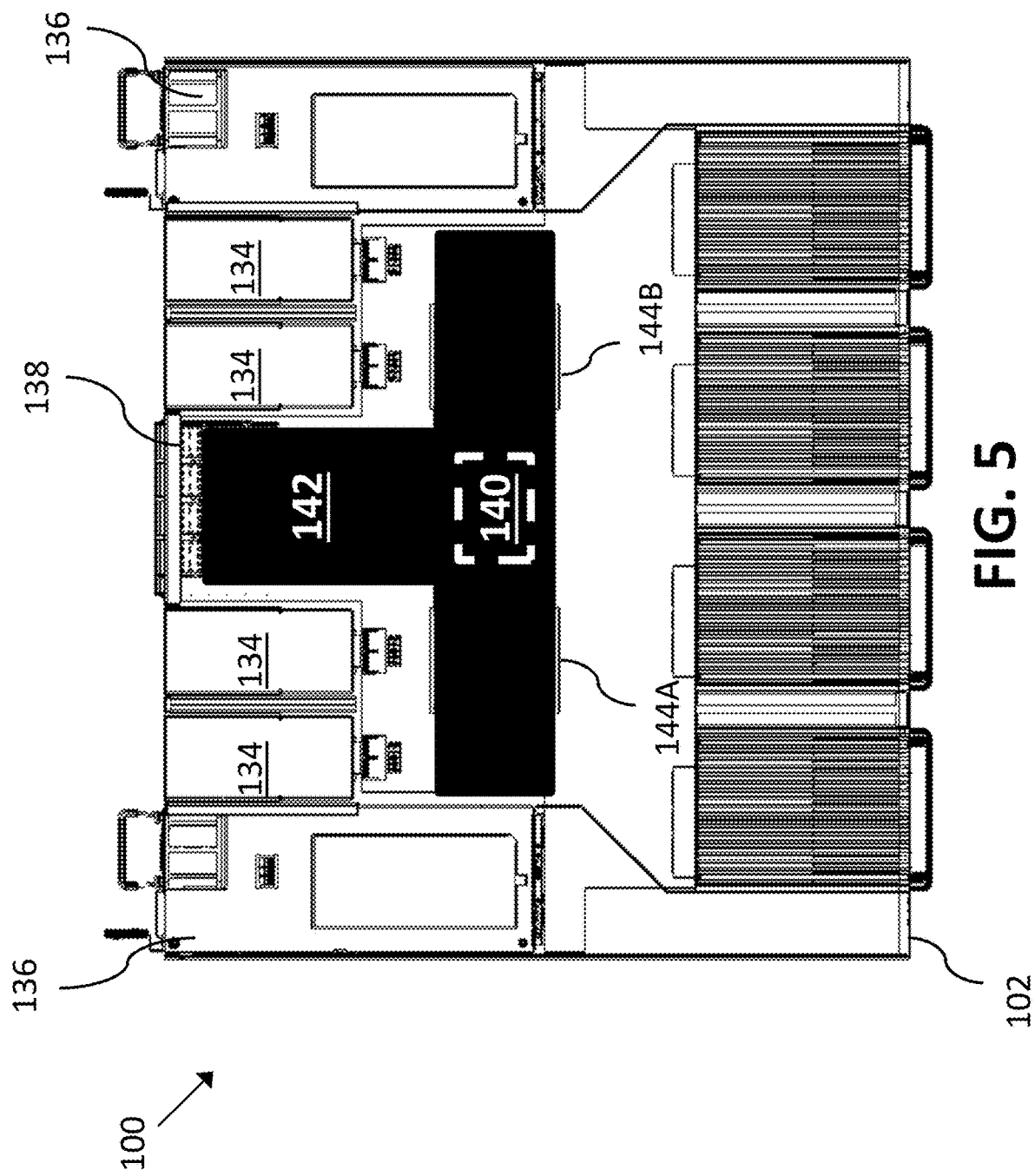
FIG. 5 shows a schematic top view of the enclosure of FIGS. 2-4, in accordance with certain embodiments of the present disclosure.

FIG. 5 shows a top view of the enclosure 100. For simplicity, not all details shown in FIGS. 3 and 4 are shown in FIG. 5.

As shown in FIG. 5, the memory modules 110 and the heat sinks 120 are positioned near the front end 102 of the enclosure 100. Near the back end 104 of the enclosure 100 are air movers 134. In certain embodiments, the air movers 134 are fans (e.g., rotatory fans) with blades that are rotated by a motor such that the fans pull air from the front end 102 of the enclosure 100 to the back end 104 of the enclosure 100. The air movers 134, as well as other electrical components within the enclosure 100, are powered by power supply units 136. The power supply units 136 can be positioned near the back end 104 of the enclosure.

Also near the back end 104 of the enclosure are data connectors 138, which communicate data to and from the enclosure 100. In certain embodiments, the data connectors 138 are electo-optical transceivers. For example, the electo-optical transceivers can be quad small formfactor pluggable (QSFP) devices. The data connectors 138 are electrically and mechanically coupled to the motherboard 128 and are communicatively coupled to the memory modules 110. Like the memory modules 100, the data connectors 138 generate heat when operating. For example, in the case of QSFP devices, the data connectors 138 can use 10-12 watts of power.

The primary electrical functions of the enclosure 100 can be managed by a central processing integrated circuit 140 (shown in dotted lines and hereinafter the "integrated circuit 140"). The integrated circuit 140 can manage the amount of power directed to the memory modules 110, the air movers 134, and other electrical components of the enclosure 100. The integrated circuit 140 can also manage data transfers to and from the enclosure 100 and the memory modules 110. In certain embodiments, the integrated circuit 140 comprises field-programmable gate arrays (FPGAs). In other embodiments, the integrated circuit 140 comprises an application-specific integrated circuit (ASIC). Like the memory modules, the integrated circuit 140 can generate heat during operation. In certain embodiments, the integrated circuit 140 consumes as much as 150 watts of power. Because of the arrangement of the memory modules 110, the heat sinks 120, and the motherboard 128, the ability to cool the integrated circuit 140 is improved compared to enclosures with midplane circuit boards that inhibit air flow towards the back end of the enclosures.

However, because the data connectors 138 are positioned at the back end 104 of the enclosure 100, there is not enough space to position additional air movers 134 directly behind the integrated circuit 140 and certain other electrical components. Further, because the integrated circuit 140 generates heat, the generated heat increases the temperature of the air passing over the data connectors 138 before exiting the back end 104 of the enclosure 100. As such, heat-generating components such as the integrated circuit 140 positioned in front of the data connectors 138—which also generate heat—are subjected to less airflow compared to components positioned immediately in front of one or more of the air movers 134. Certain embodiments of the enclosure 100 accordingly include additional cooling features.

Figure 6:
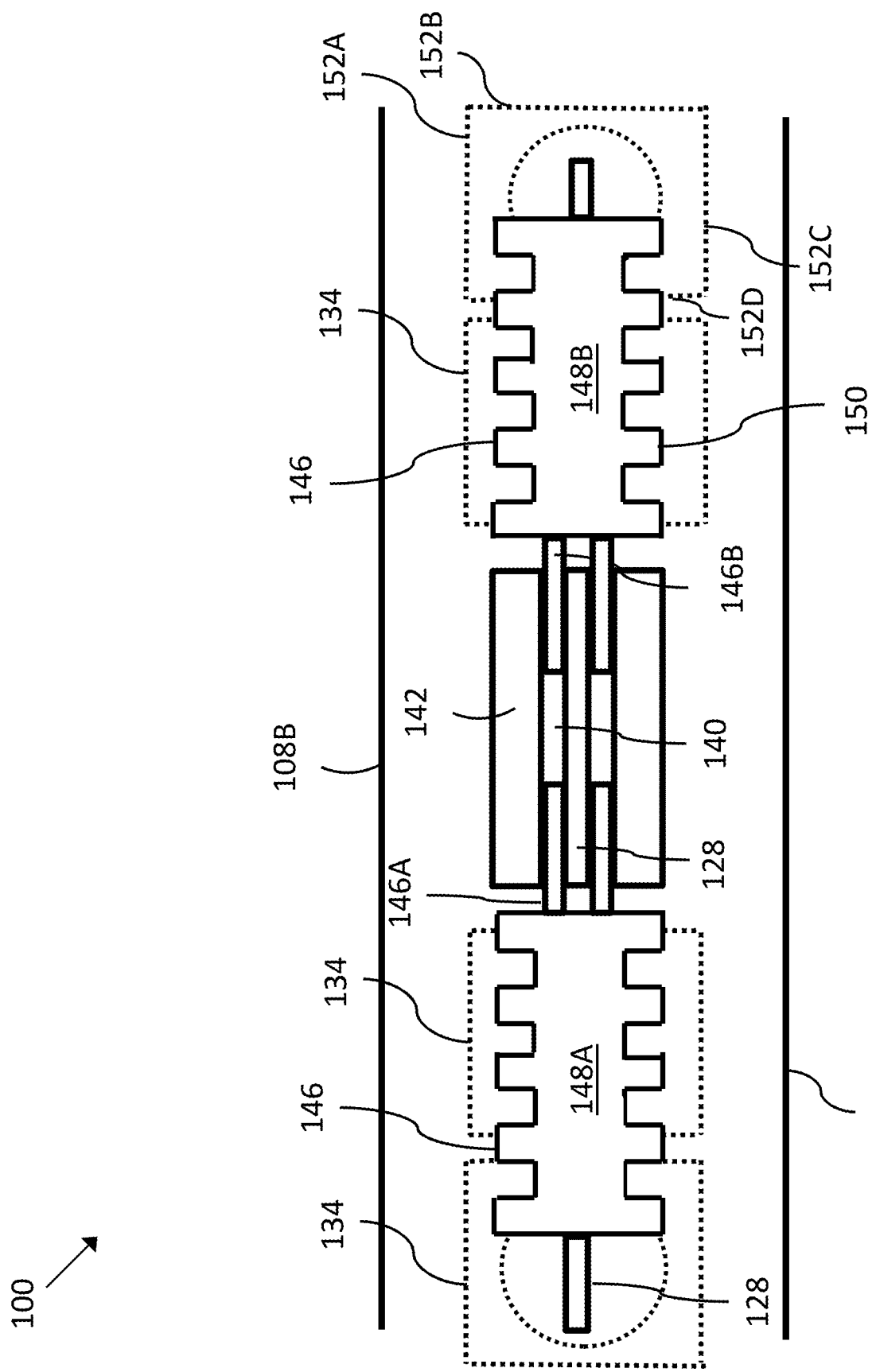
FIG. 6 shows a front cutaway view of a portion of the enclosure of FIGS. 2-4, in accordance with certain embodiments of the present disclosure.
Figure 7:
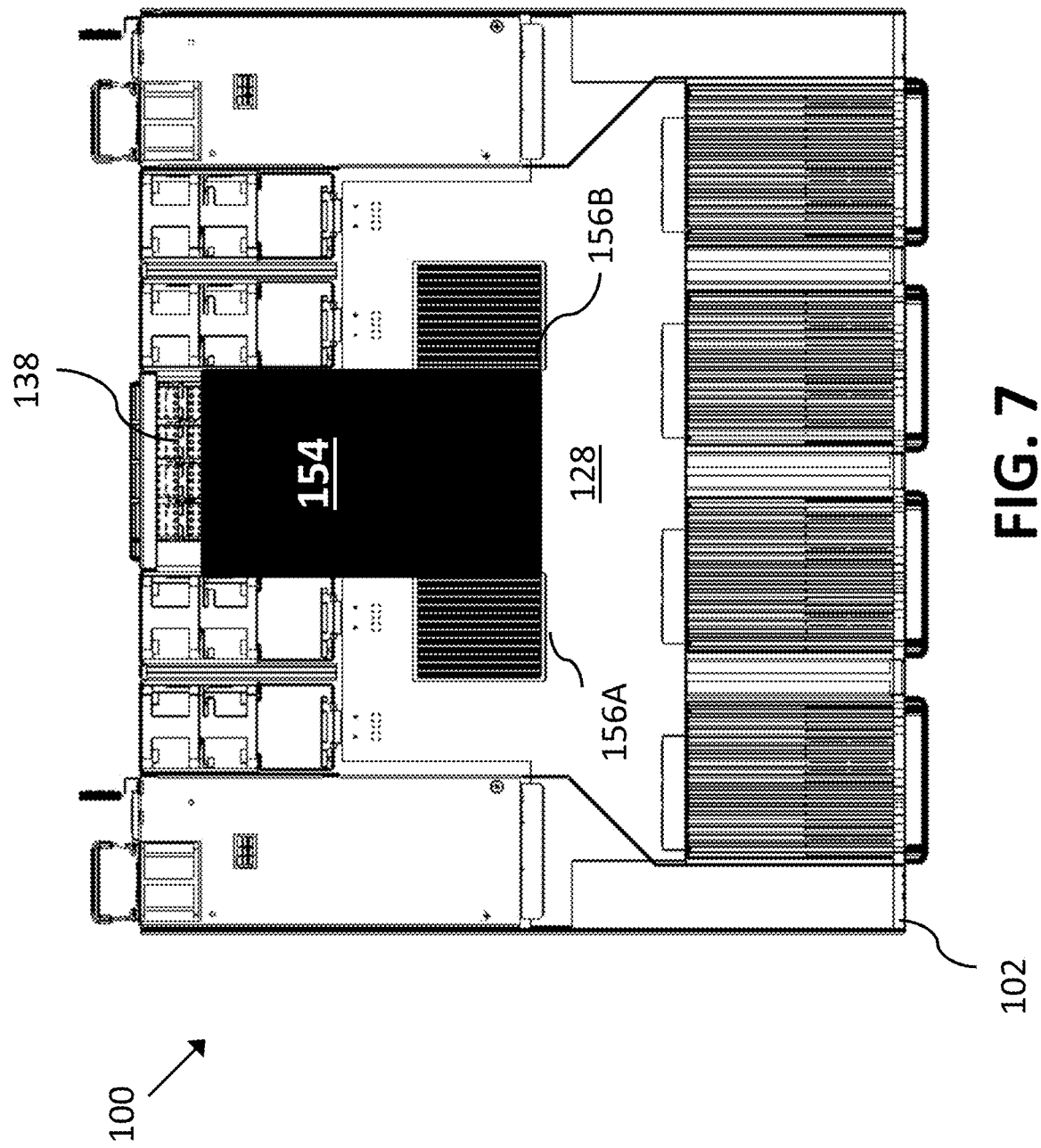
FIG. 7 shows a schematic bottom view of the enclosure of FIGS. 2-4, in accordance with certain embodiments of the present disclosure.

FIGS. 5-7 show various features that can be used together or separately to help cool heat-generating components in the enclosure 100. For simplicity, the same reference numbers are used for similar features throughout FIGS. 5-7 and the descriptions below.

FIG. 5 shows the data connectors 138 and the integrated circuit 140 thermally coupled (e.g., conductively coupled) to a conductive element such as a conductive plate 142. For example, the conductive plate 142 can be shaped to rest or contact the data connectors 138 and the integrated circuit 140. The conductive plate 142 transfers heat away from both the data connectors 138 and the integrated circuit 140. The heat can then be transferred to one or more heat sinks that at least partially extend in front of one of the air movers 134. For example, in FIG. 5, two heat sinks 144A and 144B can be thermally coupled to the conductive plate 142 and positioned below the conductive plate 142. With the arrangement of the conductive plate 142 and the heat sinks 144A and 144B, heat generated from an electrical component (e.g., the data connectors 138 and the integrated circuit 140) that is not positioned immediately in front of one of the air movers 134 can be transferred to a component (e.g., the heat sinks 144A and 144B) that is positioned immediately in front of at least one of the air movers. As such, heat-generating components are effectively cooled by the air movers 134 without the heat-generating components themselves needing to be positioned immediately in front of the air movers 134.

In certain embodiments, like that shown in FIG. 5, the conductive plate 142 and/or the heat sinks 144A and 144B extend laterally all or nearly the full width between the power supply units 136. Using this approach, the air being pulled towards the back end 104 of the enclosure 100 is forced to pass over the heat sinks 144A and 144B instead of around gaps between the power supply units 136 and the heat sinks 144A and 144B. However, in some embodiments (like the arrangement shown in FIG. 2), the conductive plate 142 and/or the heat sinks 144A and 144B may extend such that there is a gap between them and the respective power supply units 136 so that there is real estate on the motherboard 128 for conductive traces.

FIG. 6 shows another approach for cooling the data connectors 138 and the integrated circuit 140. In this approach, the conductive plate 142 is thermally coupled and/or mechanically coupled (e.g., directly coupled) to a first conductive component 146A and a second conductive component 146B. Additional conductive components can be incorporated too.

The first conductive component 146A and the second conductive component 146B are respectively thermally coupled between the integrated circuit 140 and a first heat sink 148A and a second heat sink 148B. In certain embodiments, the first conductive component 146A and the second conductive component 146B are solid structures (e.g., structures with circular, square, or rectangular cross-sections) comprising a thermally-conductive material such as metals like copper or aluminum. For example, the first conductive component 146A and the second conductive component 146B can be solid cylinders (e.g., pipe-shaped structures). In certain embodiments, the first conductive component 146A and the second conductive component 146B are hollow structures comprising a thermally-conductive material. For example, the first conductive component 146A and the second conductive component 146B can be hollow cylinders (e.g., hollow pipe-shaped structures).

As the data connectors 138 and the integrated circuit 140 generate heat, the generated heat is conductively transferred to the first conductive component 146A and the second conductive component 146B. The heat is then transferred to the first heat sink 148A and the second heat sink 148B. As shown in FIG. 6, the first heat sink 148A and the second heat sink 148B are positioned immediately in front of at least one of the air movers 134. With the arrangement of the first conductive component 146A and the second conductive component 146B and the first heat sink 148A and the second heat sink 148B, heat generated from an electrical component (e.g., the data connectors 138 and the integrated circuit 140) that is not positioned immediately in front of one of the air movers 134 can be transferred to a component (e.g., the first heat sink 148A and/or the second heat sink 148B) that is positioned immediately in front of at least one of the air movers. As such, heat-generating components are effectively cooled by the air movers 134 without the heat-generating components themselves needing to be positioned immediately in front of the air movers 134.

As shown in FIG. 6, the first heat sink 148A and the second heat sink 148B include fins 150. In certain embodiments, the first heat sink 148A and the second heat sink 148B include fins 150 on multiple sides such as the top sides and bottom sides of the heat sinks. As shown in FIG. 6, the heat sinks 148A and 148B can extend through cutouts in the motherboard 128 such that a portion of the heat sinks 148A and 148B are positioned above the motherboard 128 and another portion of the heat sinks 148A and 148B are positioned below the motherboard 128. As such, the heat sinks 148A and 148B can be cooled by air passing through the enclosure 100 on both sides of the motherboard 128.

FIG. 6 shows the air movers 134 as having generally square or rectangular outer boundaries. For example, in FIG. 6, the air mover 134 positioned farthest to the right is shown as having a top boundary 152A, a first side boundary 152B, a bottom boundary 152C, and a second side boundary 152D together which form the outer boundary of the air mover 134. If this outer boundary were to be projected directly forward (e.g., perpendicular to the front face of the air mover 134) towards the air inlet end 102, the outer boundary would define an envelope.

Components positioned immediately in front of the air mover 134 would be at least partially positioned within the envelope of the air mover 134. For example, as can be seen in FIG. 6, the first heat sink 144A is at least partially positioned within an envelope of the two left-most air movers 134, and the second heat sink 144B is at least partially positioned within an envelope of the two right-most air movers 134. This is because the first heat sink 144A and the second heat sink 144B are immediately positioned between at least one of the air movers 134 and the front end 102 of the enclosure 100. However, the integrated circuit 140 is not positioned within an envelope of any of the air movers 134 because the integrated circuit 140 is not immediately positioned between any of the air movers 134 and the front end 102 of the enclosure 100. As such, with the arrangement shown in FIG. 6, heat-generating components can be effectively cooled by the air movers 134 without the heat-generating components themselves needing to be positioned within an envelope of one of the air movers 134. This arrangement can further reduce the temperature of the data connectors 138 positioned behind (e.g., closer to the back end 104 of the enclosure 100) the integrated circuit 140.

Because the motherboard 128 is positioned approximately in the middle of the space between the lower wall 108A and the upper wall 108B, data connectors 138 can be positioned on both sides of the motherboard 128. FIG. 7 shows a bottom view of the motherboard 128 where multiple data connectors 138 are positioned on a bottom side of the motherboard 128. The enclosure 100 can include another conductive plate 154 that is thermally coupled to the data connectors 138 positioned on the bottom side of the motherboard 128. The conductive plate 154 can be thermally coupled to heat exchangers 156A and 156B that are positioned in front of at least one of the air movers 134 such that the data connectors 138 are, in effect, cooled by the air movers even though the data connectors 138 are not positioned immediately in front of one of the air movers 134. In certain embodiments, the heat exchanges 156A and 156B are the same heat exchangers 144A and 144B shown in FIG. 5. In such embodiments, the enclosure 100 would include conductive plates 142 and 154 on both sides of the motherboard 128 and both conductive plates 142 and 154 would be thermally coupled to the same heat exchangers.

Although the various cooling approaches described above with respect to a "floating" motherboard 128, these approaches can be used in enclosures where the motherboard (or main printed circuit board) is positioned along or near the floor of the enclosures. For example, all or most of the heat-generating electrical components on the main printed circuit board may be positioned between the top of the main printed circuit board and the upper wall 108B and the air movers may only or primarily draw air in this gap. Moreover, the arrangements of the conductive plate and/or heat sinks can be used in enclosures with a mid-plane circuit board.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A system comprising:
    an enclosure having an air inlet end and an air outlet end;
    air movers positioned near the air outlet end;
    a first data connector positioned near the air outlet end between the air movers;
    a heat-generating electrical component positioned immediately between the first data connector and the air inlet end;
    a first heat sink positioned immediately between at least one of the air movers and the air inlet end and positioned within a first envelope of the at least one of the air movers, the first envelope defined by a first outer boundary of the at least one of the air movers projected directly forward; and
    a first conductive pipe thermally coupled between the heat-generating electrical component and the first heat sink.

2. The system of claim 1, wherein the heat-generating electrical component in an integrated circuit, wherein the first data connector is an electro-optical transceiver, wherein the air movers are fans.

3. The system of claim 1, further comprising:
    a second heat sink positioned immediately between another one of the air movers and the air inlet end and positioned within a second envelope of the at least one of the air movers, the second envelope defined by a second outer boundary of the at least one of the air movers projected directly forward; and
    a second conductive pipe thermally coupled between the heat-generating electrical component and the second heat sink.

4. The system of claim 3, wherein the first conductive pipe and the second conductive pipe are positioned on opposite sides of the heat-generating electrical component.

5. The system of claim 1, wherein the first heat sink includes a plurality of fins.

6. The system of claim 5, wherein the fins are positioned on a top side and a bottom side of the first heat sink.

7. The system of claim 1, wherein the heat-generating electrical component is not positioned within an envelope of any of the air movers, the envelope defined by an outer boundary of the at least one of the air movers projected directly forward.

8. The system of claim 1, further comprising:
    a printed circuit board mechanically and electrically coupled to the heat-generating electrical component.

9. The system of claim 8, wherein the first data connector is directly mechanically coupled to a top side of the printed circuit board.

10. The system of claim 9, further comprising:
    additional data connectors directly mechanically coupled to a bottom side of the printed circuit board.

11. The system of claim 1, wherein the enclosure is a 1U enclosure, wherein the enclosure includes a first row of memory modules each coupled to a respective first finned heat sink and a second row of memory modules each coupled to a respective second finned heat sink.

12. An enclosure comprising:
a front air inlet end;
a rear air outlet end;
a first power supply unit and a second power supply unit;
air movers positioned between the first power supply unit and the second power supply unit and positioned near the rear air outlet end to draw air from the front air inlet end;
an integrated circuit mechanically and electrically coupled to a printed circuit board; and
a first heat sink thermally coupled to the integrated circuit and positioned within an envelope of at least one of the air movers, the envelope defined by an outer boundary of the at least one of the air movers projected directly forward.

13. The enclosure of claim 12, wherein the integrated circuit is not positioned within an envelope of any of the air movers.

14. The enclosure of claim 12, further comprising electro-optical data connectors positioned on multiple sides of the printed circuit board.

15. The enclosure of claim 12, wherein the first heat sink is thermally coupled to the integrated circuit via a first conductive pipe.

16. The enclosure of claim 15, further comprising:
a second heat sink positioned within an envelope of another one of the air movers; and
a second conductive pipe thermally coupled between the integrated circuit and the second heat sink.

17. The enclosure of claim 12, wherein the enclosure does not include a vertically-extending printed circuit board extending from the first printed circuit board.

18. A system comprising:
a 1U-sized enclosure having an air inlet end and an air outlet end;
a first air mover and a second air mover positioned near the air outlet end and within the enclosure;
an electro-optical connector positioned near the air outlet end and between the first air mover and the second air mover;
an integrated circuit positioned immediately between the electro-optical connector and the air inlet end, wherein the integrated circuit is configured to manage power directed to the first air mover and the second air mover;
a first heat sink positioned immediately between the first air mover and the air inlet end and positioned within a first envelope of the first air mover; and
a second heat sink positioned immediately between the second air mover and the air inlet end and positioned within a second envelope of the second air mover.

19. The system of claim 18, further comprising a first power supply and a second power supply, wherein the first air mover and the second air mover are positioned between the first power supply and the second power supply.

* * * * *